United States Patent [19]
Kim et al.

[11] Patent Number: 5,745,469
[45] Date of Patent: Apr. 28, 1998

[54] SIGNAL-PROCESSING PREAMPLIFIER FOR AN OPTICAL DISC SYSTEM

[75] Inventors: Chun-Sup Kim; Yong-Serk Kim, both of Suwon, Rep. of Korea

[73] Assignee: Samsung Electronics Co., Ltd., Kyungki-Do, Rep. of Korea

[21] Appl. No.: 805,726

[22] Filed: Feb. 25, 1997

[30] Foreign Application Priority Data

Feb. 26, 1996 [KR] Rep. of Korea ............. 1996-4650

[51] Int. Cl.[6] ................................. G11B 7/00
[52] U.S. Cl. ................................. 369/124; 369/44.29
[58] Field of Search ........................ 369/124, 44.29, 369/112, 48; 360/46, 65, 67

[56] References Cited

U.S. PATENT DOCUMENTS 5,436,771  7/1995  Yun ............................. 360/65

Primary Examiner—Nabil Hindi
Attorney, Agent, or Firm—Sughrue, Mion, Zinn, Macpeak & Seas, PLLC

[57] ABSTRACT

A preamplifier for an optical disc system. The preamplifier is based on an automatic gain control (AGC) system for obtaining a constant response and a stable output signal for input signals of a certain amplitude. The preamplifier includes a radio frequency amplifier for amplifying an output signal from the pick-up unit, an AGC unit for amplifying an output signal from the radio frequency amplifier to a desired level, an AGC detector unit coupled at its input terminal to an output terminal of the AGC unit and at its output terminal to an input terminal of the AGC unit. The AGC detector unit serves to rectify an output signal from the AGC unit, compare the rectified signal with a reference signal having a predetermined level, and send the resultant signal obtained by the comparison to the AGC unit. A mode selecting unit is coupled to the AGC detector unit and adapted to select one of several modes of operation, respectively corresponding to different equalization characteristics.

10 Claims, 2 Drawing Sheets

SIGNAL-PROCESSING PREAMPLIFIER FOR AN OPTICAL DISC SYSTEM

BACKGROUND OF THE INVENTION

The present invention relates to an optical disc system for reproducing signals from an optical disc, such as a mini disc or digital video disc. More particularly, the present invention is directed to an optical disc system, which includes a signal-processing preamplifier that compensates for signal attenuation caused by, for example, instantaneous variations in the rotating speed of the optical disc or particular characteristics of the optical disc during the reproduction of signals from an optical disc.

Conventional preamplifiers used in optical disc systems have a complex circuit configuration because they use various equalization amplifiers having different characteristics suitable for various kinds of optical discs. Furthermore, such conventional preamplifiers cannot manage a change (i.e., increase or decrease) in the amplitude of signals reproduced from an optical disc. Typically, such variations in the amplitude result from instantaneous variations of the rotating speed of the optical disc. In addition, because conventional preamplifiers use various amplifiers to suit different control operations, their performance is compromised.

FIG. 1 illustrates a block diagram of a conventional preamplifier in an optical disc system, which may be an MD or DVD system. The optical disc system includes a pick-up unit 10 for reading an optical signal from an optical disc, a preamplifier 50, which includes a radio frequency (RF) amplifier 20 for amplifying the read signal and an equalization amplifier 30 for varying the frequency characteristics of the optical signal in accordance with the type of optical disc, and a signal processing unit 40 for appropriately processing the optical signal output from the equalization amplifier 30 of the preamplifier 50. Since the read signal output from the pick-up unit 10 has a very small amplitude, it is amplified by the RF amplifier 20. The amplified signal is then sent to the equalization amplifier 30 which, in turn, generates a signal having a desired level. The output signal from the equalization amplifier 30 is then sent to the signal processing unit 40.

Although only one equalization amplifier is shown in FIG. 1, an optical disc system typically has a plurality of equalization amplifiers respectively corresponding to different operation modes thereof. For example, in a DVD system, which has at least six operational modes, at least six equalization amplifiers having different equalization characteristics are required and thus used. The mode selection switch 60 selects an appropriate one of the equalization amplifiers in accordance with a selected operation mode.

SUMMARY OF THE INVENTION

Therefore, in view of the foregoing problems and disadvantages of the conventional art, it is an object of the present invention to provide a preamplifier for an optical disc system which uses an automatic gain control (AGC) system, thereby obtaining a constant response and a stable output signal for input signals of a certain amplitude.

In accordance with the present invention, the above and other objects are accomplished by providing a preamplifier for an optical disc system including a pick-up unit for reading an optical signal from an optical disc and a signal processing unit for processing the optical signal. The preamplifier includes a radio frequency amplifier for amplifying an output signal from the pick-up unit, an automatic gain control unit for amplifying an output signal from the radio frequency amplifier to a desired level, an automatic gain control detector unit coupled at its input terminal to an output terminal of the automatic gain control unit and at its output terminal to an input terminal of the automatic gain control unit, the automatic gain control detector unit serving to rectify an output signal from the automatic gain control unit, to compare the rectified signal with a reference signal having a predetermined level and to send the resultant signal obtained by the comparison to the automatic gain control unit, and a mode selecting unit coupled to the automatic gain control detector unit and adapted to select one of several modes respectively corresponding to different equalization characteristics.

BRIEF DESCRIPTION OF THE DRAWINGS

Other objects and aspects of the present invention will become readily apparent from the following description of preferred embodiments with reference to the accompanying drawings in which.

DETAILED DESCRIPTION OF PREFERRED EMBODIMENTS OF THE INVENTION

Figure 1:
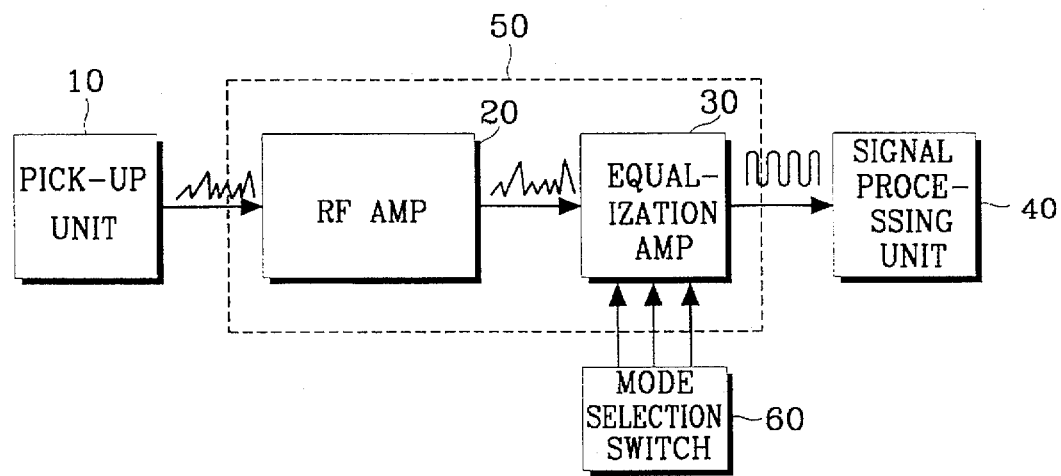
FIG. 1 is a block diagram illustrating the configuration of a conventional preamplifier.
Figure 2:
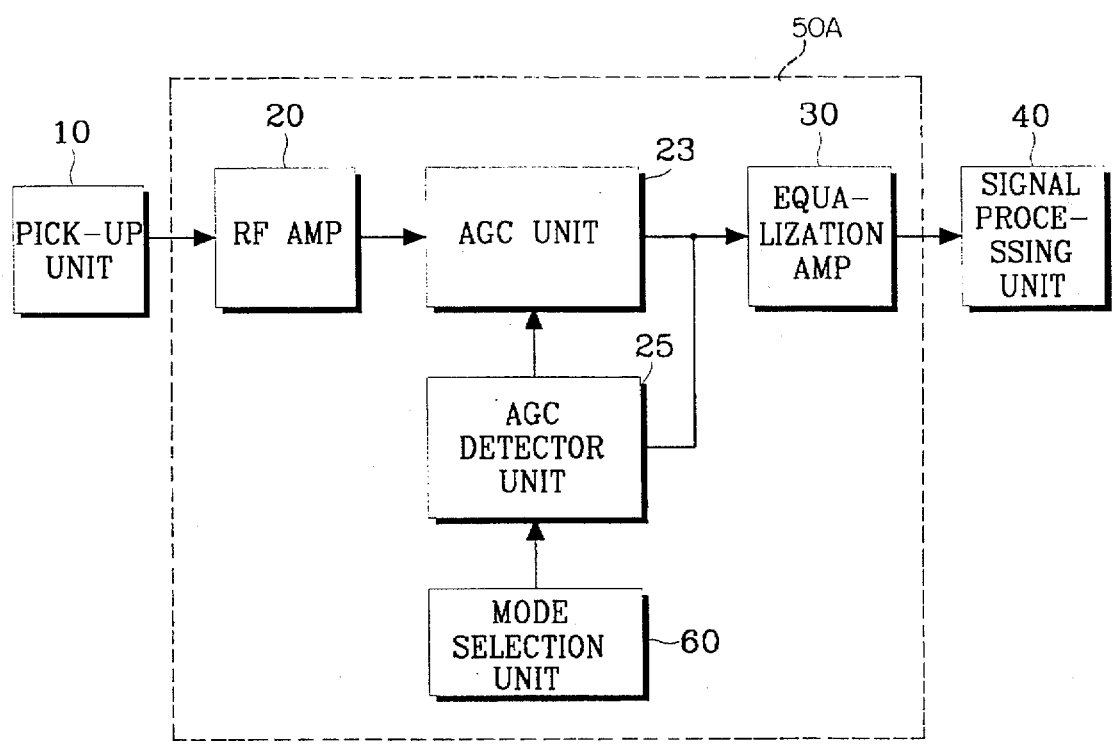
FIG. 2 is a block diagram illustrating the configuration of a signal-processing preamplifier in accordance with the present invention.

Referring to FIG. 2, an optical disc system using a signal-processing preamplifier according to a preferred embodiment of the present invention is illustrated. In FIG. 2, elements respectively corresponding to those in FIG. 1 are denoted by the same reference numerals.

As shown in FIG. 2, the optical disc system has a configuration similar to that in FIG. 1 except for the signal-processing preamplifier. That is, the signal-processing preamplifier 50a of FIG. 2 includes an automatic gain control (AGC) unit 23 for amplifying an output signal from the RF amplifier 20 to a desired level, an AGC detector unit 25 coupled at its input terminal to the output terminal of the AGC unit 23 and at its output terminal to the input terminal of the AGC unit 23, and a mode selecting unit 60 coupled to the AGC detector unit 25. An equalization amplifier 30 controls the characteristics of a particular frequency. An output signal from the RF amplifier 20 is adjusted to a desired level by the AGC unit 23 and AGC detector unit 25. The AGC unit 23 and AGC detector unit 25 operate to perform the function of an equalization amplifier.

Figure 3:
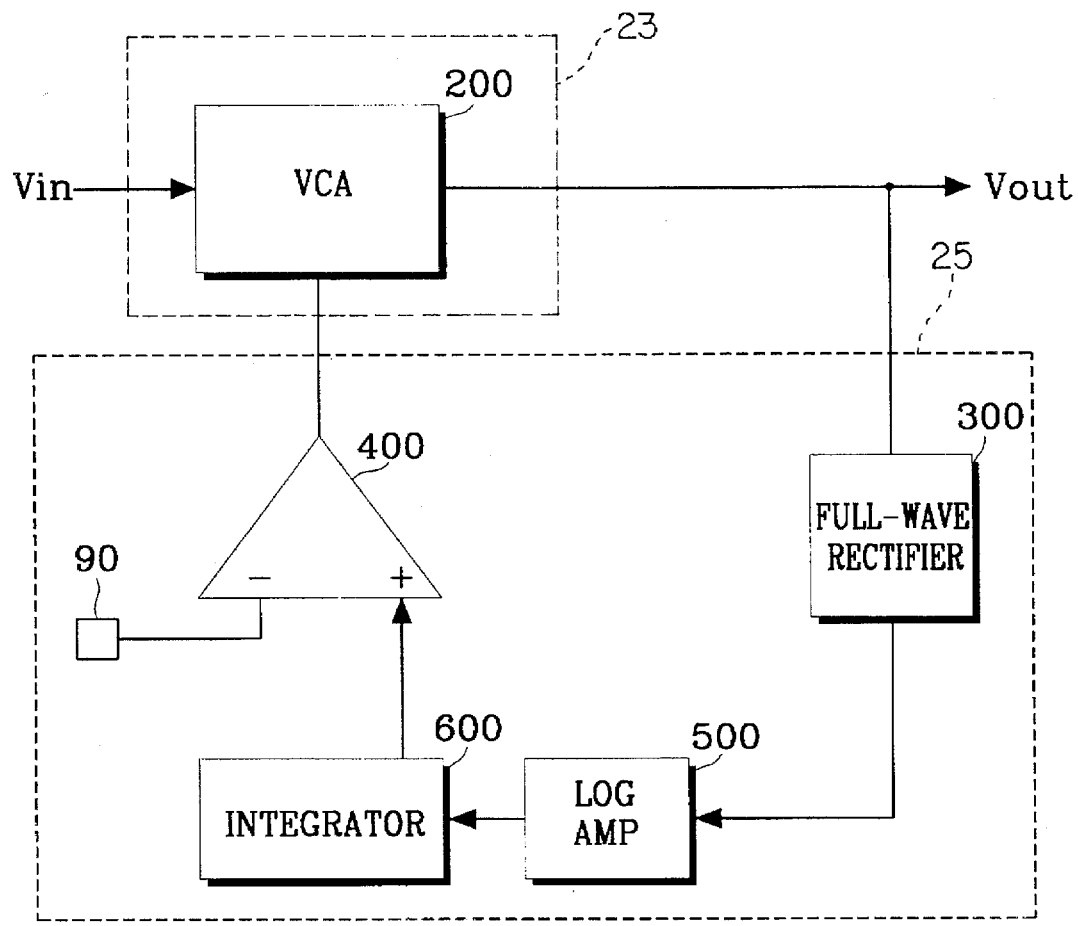
FIG. 3 is a block diagram illustrating an AGC unit and an AGC detector unit both included in the signal-processing preamplifier of FIG. 2.

FIG. 3 is a block diagram illustrating the AGC unit 23 and AGC detector unit 25 of the preamplifier 50a. The AGC unit 23 includes a voltage control amplifier (VCA) 200 for amplifying an input signal Vin. The AGC detector unit 25 includes a full-wave rectifier 300 for outputting a full-wave rectified signal in response to the amplified signal from the VCA 200, a logarithmic amplifier (LOG AMP) 500 for receiving a linear signal, which may be the full-wave rectified signal from the full-wave rectifier 300, and outputting a logarithmically amplified signal, and an integrator 600 for receiving the output signal from the logarithmic amplifier 500 and converting it into a DC signal. The AGC detector unit 25 further includes a comparator 400 coupled at its one input terminal to an AGC level controlling terminal 90 which provides a reference signal, and at its other input terminal to the output signal of the integrator 600. The comparator 400 outputs to the VCA 200 a signal representative of the comparison of the reference signal and output of the integrator 600.

As apparent from the above description, the present invention provides a signal-processing preamplifier which uses an automatic gain control (AGC) system, thereby obtaining a constant response and a stable output signal for input signals of a certain amplitude.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A preamplifier for an optical disc system including a pick-up unit for reading an optical signal from an optical disc and a signal processing unit for processing the optical signal, said preamplifier comprising:
   a radio frequency amplifier for amplifying an output signal from the pick-up unit;
   an automatic gain control unit for amplifying an output signal from the radio frequency amplifier to a desired level;
   an automatic gain control detector unit having an input and output terminal respectively coupled to an output and input terminal of said automatic gain control unit, said automatic gain control detector unit being operative to rectify an output signal from said automatic gain control unit, to compare the rectified signal with a predetermined reference signal, and to output a signal representative of the comparison of the rectifed signal and the predetermined reference signal to said automatic gain control unit; and
   a mode selecting unit, coupled to the automatic gain control detector unit, being operative to select one of several modes of operation, respectively corresponding to different equalization characteristics.

2. The preamplifier in accordance with claim 1, further comprising an equalization amplifier, coupled to an output of said automatic gain control unit, for stably outputting a signal having a set frequency at a constant level to allow said automatic gain control unit and said automatic gain control detector unit to adjust characteristics of said set frequency.

3. The preamplifier in accordance with claim 1, wherein said automatic gain control unit and said automatic gain control detector unit comprise means for adjusting characteristics of a frequency, thereby stably outputting the particular frequency at a constant level.

4. The preamplifier in accordance with claim 1, wherein said automatic gain control unit comprises a voltage control amplifier.

5. The preamplifier in accordance with claim 1, wherein said automatic gain control detector unit comprises:
   a full-wave rectifier for outputting a full-wave rectified linear signal in response to a signal amplified by said automatic gain control unit;
   a logarithmic amplifier for receiving the linear signal output from the full-wave rectifier and outputting a logarithmically amplified signal;
   an integrator for receiving the logarithmically amplified signal from the logarithmic amplifier and converting the logarithmically amplified signal into a DC signal; and
   a comparator for receiving the predetermined reference signal from an automatic gain control level controlling terminal at one input terminal thereof and the DC signal from said integrator at the other input terminal thereof, comparing said predetermined reference signal and said DC signal, and outputting a signal corresponding to the comparison of said predetermined reference signal and said DC signal to said automatic gain control unit.

6. A disc system comprising:
   a pick-up unit for receiving a signal reproduced from a disc;
   a preamplifier, coupled to an output of said pick-up unit, for amplifying a signal output by said pick-up unit and outputting an amplified signal; and
   a signal processing unit for processing said amplified signal, wherein said preamplifier comprises:
   a radio frequency amplifier for amplifying said signal output by said pick-up unit;
   an automatic gain control unit, coupled to an output of said radio frequency amplifier, for amplifying an output signal from the radio frequency amplifier to a desired level;
   an automatic gain control detector unit, coupled to an output of said automatic gain control unit, said automatic gain control detector unit being operative to rectify an output signal from said automatic gain control unit, to compare the rectified signal with a predetermined reference signal, and to output to said automatic gain control unit a signal representative of the comparison of the rectifed signal and said predetermined reference signal; and
   a mode selector, coupled to said automatic gain control detector unit, for selecting one of several modes of operation, respectively corresponding to different equalization characteristics.

7. The disc system as defined by claim 6, wherein said preamplifier further comprises an equalization amplifier, coupled to an output of said automatic gain control unit, for stably outputting a signal having a set frequency at a constant level to allow said automatic gain control unit and said automatic gain control detector unit to adjust characteristics of said set frequency.

8. The disc system as defined by claim 6, wherein said automatic gain control unit and said automatic gain control detector unit comprise means for adjusting characteristics of a frequency to stably output said set frequency at a constant level.

9. The disc system as defined by claim 6, wherein said automatic gain control unit comprises a voltage control amplifier.

10. The disc system as defined by claim 6, wherein said automatic gain control detector unit of said preamplifier comprises:
   a full-wave rectifier for outputting a full-wave rectified linear signal in response to a signal amplified by said automatic gain control unit;
   a logarithmic amplifier for receiving the linear signal output from the full-wave rectifier and outputting a logarithmically amplified signal;
   an integrator for receiving the logarithmically amplified signal from the logarithmic amplifier and converting the logarithmically amplified signal into a DC signal; and
   a comparator for receiving the predetermined reference signal from an automatic gain control level controlling terminal at one input terminal thereof and the DC signal from said integrator at the other input terminal thereof, comparing said predetermined reference signal and said DC signal, and outputting a signal corresponding to the comparison of said predetermined reference signal and said DC signal to said automatic gain control unit.

\* \* \* \* \*